US009722099B2

(12) United States Patent
Tsai et al.

(10) Patent No.: US 9,722,099 B2
(45) Date of Patent: Aug. 1, 2017

(54) LIGHT SENSING DEVICE WITH OUTGASSING HOLE IN A LIGHT SHIELDING LAYER AND AN ANTI-REFLECTION FILM

(71) Applicant: Taiwan Semiconductor Manufacturing Company, Ltd., Hsin-Chu (TW)

(72) Inventors: Tsung-Han Tsai, Zhunan Township (TW); Kuo-Cheng Lee, Tainan (TW); Shiu-Ko JangJian, Tainan (TW); Chi-Cherng Jeng, Madou Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 390 days.

(21) Appl. No.: 13/949,993

(22) Filed: Jul. 24, 2013

(65) Prior Publication Data
US 2014/0263944 A1 Sep. 18, 2014

Related U.S. Application Data

(60) Provisional application No. 61/783,314, filed on Mar. 14, 2013.

(51) Int. Cl.
*H01L 31/0216* (2014.01)
*H01L 27/146* (2006.01)

(52) U.S. Cl.
CPC .... *H01L 31/02164* (2013.01); *H01L 27/1462* (2013.01); *H01L 27/1464* (2013.01); *H01L 27/14623* (2013.01); *H01L 27/14685* (2013.01); *H01L 31/02161* (2013.01)

(58) Field of Classification Search
CPC ............ H01L 31/0203; H01L 31/0232; H01L 31/02161; H01L 31/02164; H01L 31/02165; H01L 31/02162; H01L 27/14618; H01L 27/14625; H01L 27/1464; H01L 27/14623; H01L 27/1462; H01L 27/14685; H01L 2924/15151; H01L 23/34; H01L 31/024
USPC ...... 250/208.1, 239, 216, 229, 214.1, 237 R; 257/434, 432, 433, 431, 435, 437, 436, 257/460, E31.121, E31.119
See application file for complete search history.

(56) References Cited

U.S. PATENT DOCUMENTS

| 8,847,146 B2 * | 9/2014 | Tu .......................... H01L 23/10 250/239 |
| 2007/0007459 A1 | 1/2007 | Shibayama et al. |
| 2007/0224722 A1 | 9/2007 | Matthews et al. |
| 2008/0237769 A1 * | 10/2008 | Okihara ............ H01L 27/14623 257/435 |

(Continued)

FOREIGN PATENT DOCUMENTS

| CN | 1774809 A | 5/2006 |
| KR | 20100073336 A | 7/2010 |
| WO | 9723909 A1 | 7/1997 |

*Primary Examiner* — Que T Le
*Assistant Examiner* — Jennifer Bennett
(74) *Attorney, Agent, or Firm* — Slater Matsil, LLP

(57) ABSTRACT

A light sensing device includes a substrate, a light sensing area on the substrate, and a light shielding layer over the substrate. The light shielding layer does not cover the light sensing area. At least one outgassing hole is formed through the light shielding layer.

20 Claims, 3 Drawing Sheets

(56) References Cited

U.S. PATENT DOCUMENTS

| | | | | |
|---|---|---|---|---|
| 2009/0302408 A1* | 12/2009 | Nakagawa | .......... | H01L 27/1462 257/432 |
| 2010/0200898 A1* | 8/2010 | Lin | .................. | H01L 27/14618 257/294 |
| 2011/0169118 A1* | 7/2011 | Sano | ................ | H01L 27/14618 257/432 |
| 2011/0260275 A1* | 10/2011 | Cho | ................ | H01L 27/14618 257/432 |
| 2011/0261223 A1* | 10/2011 | Akiyama | .......... | H01L 27/14623 348/222.1 |
| 2012/0061786 A1* | 3/2012 | Hutto | ............... | H01L 21/76898 257/432 |
| 2012/0153419 A1* | 6/2012 | Itonaga | ............ | H01L 21/76898 257/432 |
| 2013/0113065 A1* | 5/2013 | Qian | ................ | H01L 27/14636 257/437 |

\* cited by examiner

LIGHT SENSING DEVICE WITH OUTGASSING HOLE IN A LIGHT SHIELDING LAYER AND AN ANTI-REFLECTION FILM

This application claims priority to U.S. Provisional Application Ser. No. 61/783,314, filed on Mar. 14, 2013, entitled "Light Sensing Device with Outgassing Hole," which application is hereby incorporated herein by reference.

TECHNICAL FIELD

The present disclosure relates generally to an integrated circuit and more particularly a light sensing device.

BACKGROUND

Some light sensing devices such as complementary metal-oxide-semiconductor (CMOS) image sensors suffer from delamination of a bottom anti-reflective coating (BARC) film from a substrate (e.g., silicon) surface after a high-temperature thermal process. Unwanted moisture and gas absorbed during a fabrication process results in the delamination. A method and a structure to prevent such delamination are desired.

BRIEF DESCRIPTION OF THE DRAWINGS

Reference is now made to the following descriptions taken in conjunction with the accompanying drawings, in which.

DETAILED DESCRIPTION

Figure 1A:
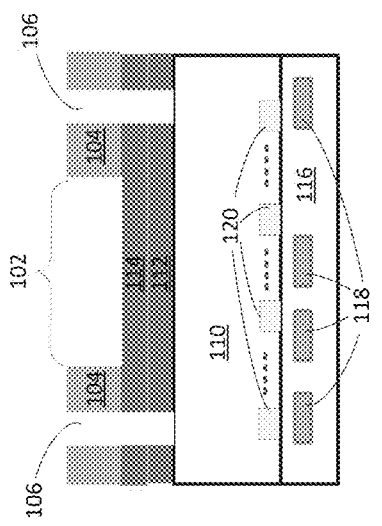
FIG. 1A is a schematic diagram of an exemplary light sensing device according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic diagram of an exemplary light sensing device 100 according to some embodiments. The light sensing device 100 includes a light sensing area 102 on a substrate 110 (shown in FIG. 1B) and a light shielding layer 104 over the substrate 110. The light shielding layer 104 does not cover the light sensing area 102. At least one outgassing hole 106 is formed through the light shielding layer 104. In FIG. 1A, four outgassing holes 106 having a linear shape are formed on four sides of the light sensing area 102 that has a rectangular shape.

Figure 1B:
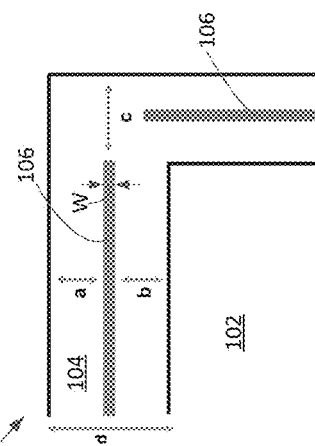
FIG. 1B is a cross section diagram of the exemplary light sensing device in FIG. 1A according to some embodiments.

FIG. 1B is a cross section diagram of the exemplary light sensing device 100 in FIG. 1A along a line 108 according to some embodiments. The substrate 110 is shown with its back side on top. The substrate 110 can comprise silicon or any other suitable material. The substrate 110 may have various devices 120 such as transistors, photodiodes, etc. and components such as resistors, capacitors, inductors, etc. formed on its front side. A dielectric layer 116 and a metal layer 118 are shown as exemplary layers that can be implemented on the front side of the substrate 110 and there can be other layers, devices, and components in other embodiments.

Two bottom anti-reflective coating (BARC) films 112 and 114 are formed over the back side of the substrate 110. In some embodiments, the back side of the substrate 110 is thinned by chemical mechanical polishing (CMP) or wet etching process prior to forming the BARC films 112 and 114. In some embodiments, the BARC films 112 and 114 have a combined thickness ranging from 50 Å to 1000 Å or more.

The BARC films 112 and 114 can comprise various materials known in the art including organic material and inorganic material. Inorganic BARC films can be chemical vapor deposition (CVD) films based on the principle of destructive interference to eliminate reflectivity and need good thickness control in the BARC layer. Organic BARC films are generally spin-on polymeric materials that reduce substrate reflectivity by absorbing exposure radiation with less restriction in thickness control. The organic spin-on BARCs also provide a level of planarization efficiency prior to photoresist deposition to improve depth of focus and process window in the photolithography step.

In some embodiments, the BARC films 112 and 114 comprise high-k dielectric material. The high-k dielectric material include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or any other suitable material.

The first BARC film 112 over the substrate 110 can be deposited by atomic layer deposition (ALD) at a relatively low temperature to reduce damage to the substrate 110 and dark current. The second BARC film 114 can be deposited by CVD or physical vapor deposition (PVD). In some other embodiments, there can be one anti-reflective coating film or more than two anti-reflective coating films.

The light shielding layer 104 is formed over the BARC films 112 and 114. The light shielding layer 104 can comprise metal such as copper, aluminum, tungsten, or any other suitable material that can prevent light transmission through the light shielding layer 104. The light shielding layer 104 has a thickness ranging from 1000 Å to 3000 Å in some embodiments. The light shielding layer 104 can be deposited by CVD or PVD, for example.

The outgassing holes 106 are formed through the light shielding layer 104 and the BARC films 112 and 114 outside of the light sensing area 102. The outgassing holes 106 can be formed by etching process using photolithography. The outgassing holes 106 help to release unwanted gas such as fluorine, chlorine, etc., and moisture absorbed in the BARC films 112 and 114 or other layers during fabrication processes. This prevents layer delamination in a subsequent fabrication process such as a thermal process. In some embodiments, the outgassing hole 106 is formed at least partially through the BARC film such as 112 and 114.

Figure 1C:
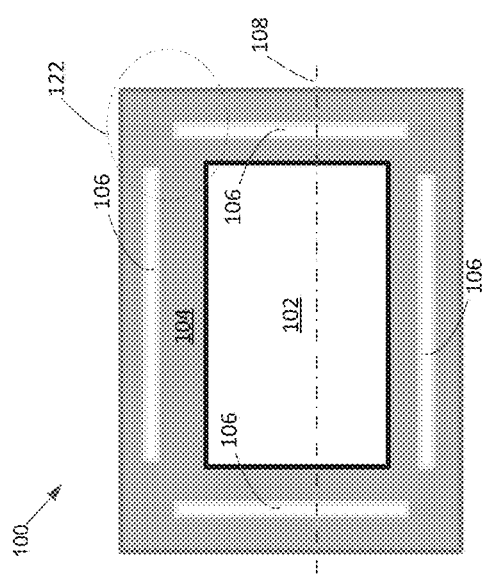
FIG. 1C is a schematic diagram of a portion of the exemplary light sensing device in FIG. 1A according to some embodiments.

FIG. 1C is a schematic diagram of a portion 122 of the exemplary light sensing device 100 in FIG. 1A according to some embodiments. The outgassing hole 106 has a width W of at least 1 μm in some embodiments. The distance a, b, and c between the outgassing hole 106 and the edge of the light shielding layer 104 is at least 1 μm in some embodiments. The light shielding layer 104 has a width d that is at least 10 μm in some embodiments. The outgassing hole 106 has a linear shape in FIG. 1C, but can have a rectangular, square, circle, oval shape, or any other shape in other embodiments.

Figure 2:
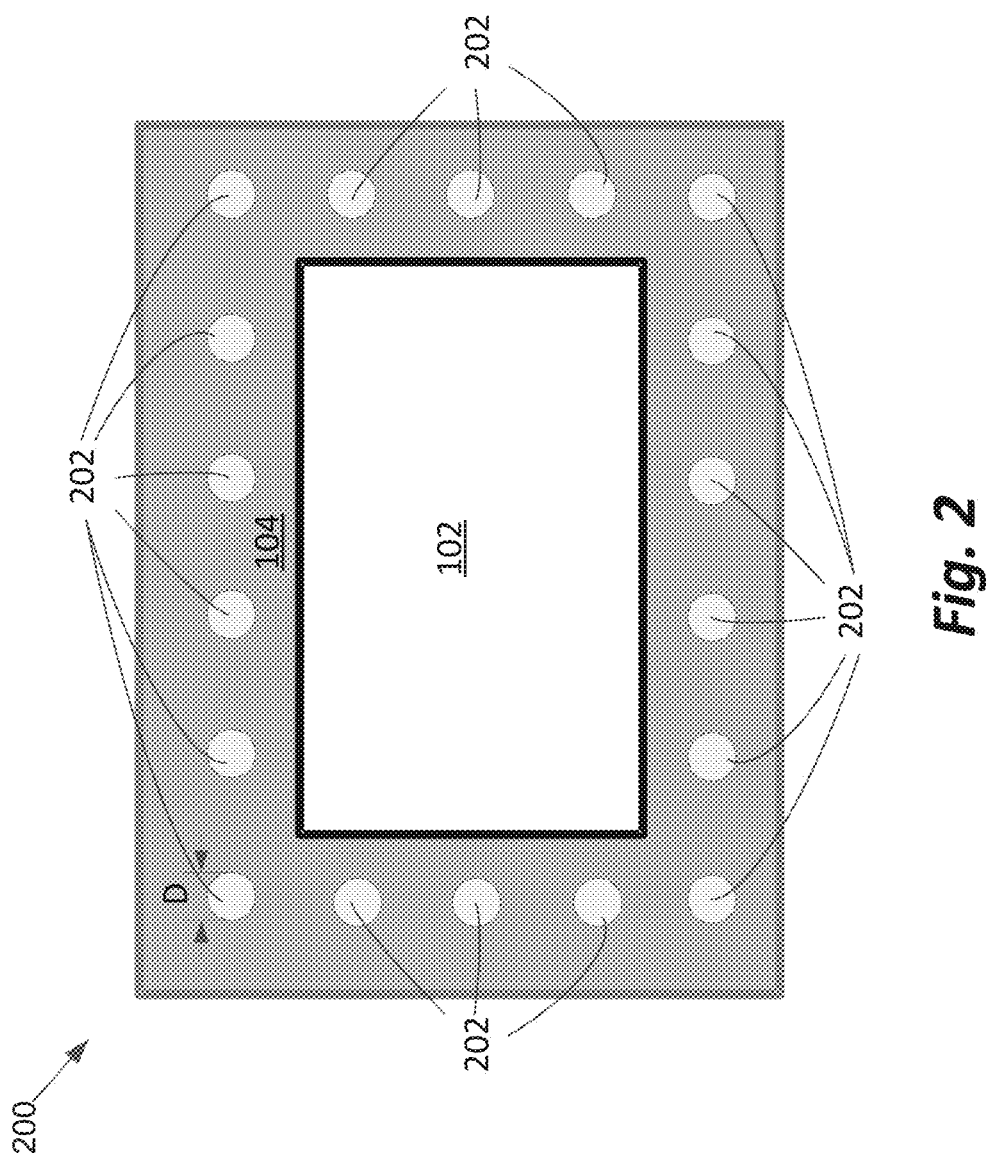
FIG. 2 is a schematic diagram of another exemplary light sensing device according to some embodiments.

FIG. 2 is a schematic diagram of another exemplary light sensing device 200 according to some embodiments. The multiple circular outgassing holes 202 are distributed in a linear pattern along the light shielding layer 104 with generally uniform spacing between them. The outgassing holes 202 have a diameter D of at least 1 μm in some embodiments. In other embodiments, the outgassing holes 202 can have a different shape such as rectangular, square, circle, oval shape, or any other shape, and can have a non-uniform spacing between them.

Figure 3:
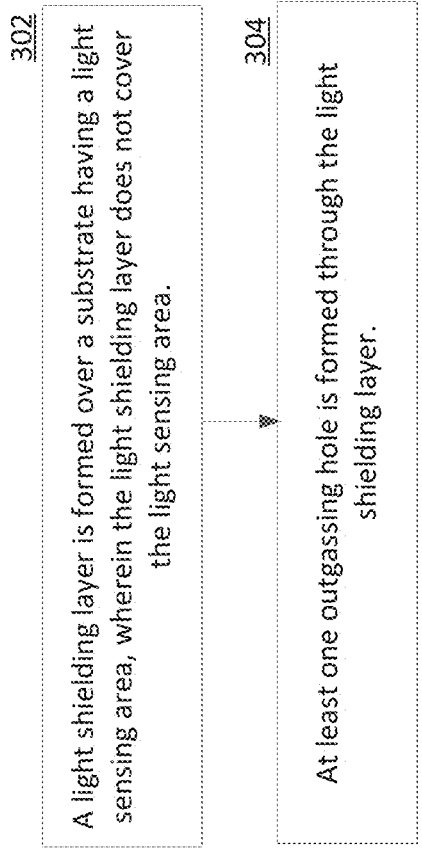
FIG. 3 is a flowchart of a method of fabricating the exemplary light sensing device in FIG. 1A according to some embodiments.

FIG. 3 is a flowchart of a method of fabricating the exemplary light sensing device 100 in FIG. 1A according to some embodiments. At step 302, a light shielding layer 104 is formed over a substrate 110 having a light sensing area 102. The light shielding layer 104 does not cover the light sensing area 102.

The light shielding layer 104 can comprise metal such as copper, aluminum, tungsten, or any other suitable material that can prevent light transmission through the light shielding layer 104 outside the light sensing area 102. The light shielding layer 104 has a thickness ranging from 1000 Å to 3000 Å in some embodiments. The light shielding layer 104 can be deposited by CVD or PVD, for example.

At step 304, at least one outgassing hole 206 is formed through the light shielding layer 104 outside of the light sensing area 102. The outgassing hole 106 can be formed by etching process using photolithography. The outgassing hole 106 helps to release unwanted gas such as fluorine, chlorine, etc., and moisture in the structure of the light sensing device 100 during fabrication processes. This prevents layer delamination in the fabrication process such as a thermal process.

In some embodiments, The outgassing hole 106 is formed at least 1 μm away from any edge of the light shielding layer 104, has a width or a diameter of at least 1 μm, and the light shielding layer 104 has a width that is at least 10 μm.

In some embodiments, an anti-reflective coating film such as BARC film 112 and/or 114 is formed between the light shielding layer 104 and the substrate 110, and the outgassing hole 106 is formed at least partially through anti-reflective coating film such as BARC film 112 and/or 114. In some embodiments, the BARC films have a combined thickness ranging from 50 Å to 1000 Å or more. The BARC films 112 and 114 can comprise various materials known in the art including organic material and inorganic material.

In some embodiments, the BARC films 112 and 114 comprise high-k dielectric material. The high-k dielectric material include hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or any other suitable material.

The first BARC film 112 over the substrate 110 can be deposited by atomic layer deposition (ALD) at a relatively low temperature to reduce damage to the substrate 110, which reduces dark current. The second BARC film 114 can be deposited by CVD or PVD. In some other embodiments, there can be one anti-reflective coating film or more than two anti-reflective coating films. In some embodiments, the back side of the substrate 110 is thinned by chemical mechanical polishing (CMP) or wet etching process prior to forming the BARC films 112 and 114.

According to some embodiments, a light sensing device includes a substrate, a light sensing area on the substrate, and a light shielding layer over the substrate. The light shielding layer does not cover the light sensing area. At least one outgassing hole is formed through the light shielding layer.

According to some embodiments, a method of fabricating a light sensing device includes forming a light shielding layer over a substrate having a light sensing area. The light shielding layer does not cover the light sensing area. At least one outgassing hole is formed through the light shielding layer.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A light sensing device, comprising:
   a substrate;
   a light sensing area on the substrate;
   an anti-reflective coating film over the substrate;
   a light shielding layer over the anti-reflective coating film, the light shielding layer not covering the light sensing area, the light shielding layer comprising a conductive material; and at least one outgassing hole formed through the light shielding layer, the at least one outgassing hole completely extending through the light shielding layer, the at least one outgassing hole at least partially extending through the anti-reflective coating film, portions of the conductive material exposed by all sidewalls of the at least one outgassing hole forming a single continuous region of the conductive material, an entire area of the substrate enclosed by a perimeter of the least one outgassing hole being free from the conductive material, the at least one outgassing hole being configured to release gasses and moisture absorbed in the anti-reflective coating film.

2. The light sensing device of claim 1, wherein the anti-reflective coating film comprises high-k dielectric material.

3. The light sensing device of claim 1, wherein the anti-reflective coating film comprises multiple layers.

4. The light sensing device of claim 1, wherein the light shielding layer comprises copper, aluminum, or tungsten.

5. The light sensing device of claim 1, wherein the at least one outgassing hole has a width or a diameter of at least 1 μm.

6. The light sensing device of claim 1, wherein the at least one outgassing hole is at least 1 μm away from an edge of the light shielding layer.

7. The light sensing device of claim 1, wherein the light shielding layer has a width of at least 10 μm.

8. The light sensing device of claim 1, wherein the at least one outgassing hole has a linear, rectangular, square, circle, or oval shape.

9. The light sensing device of claim 1, wherein four outgassing holes having a linear shape surrounding on four sides the light sensing area that has a rectangular shape.

10. The light sensing device of claim 1, wherein multiple circular outgassing holes are distributed in a linear pattern along the light shielding layer with uniform spacing in between.

11. A method of fabricating a light sensing device:
forming an anti-reflective coating film over a substrate having a light sensing area;
forming a light shielding layer over the anti-reflective coating film, wherein the light shielding layer does not cover the light sensing area, the light shielding layer comprising a conductive material; and
patterning the light shielding layer to form at least one outgassing hole through the light shielding layer and at least partially through the anti-reflective coating film, a single continuous portion of the conductive material extending along all sidewalls of the at least one outgassing hole, an entire area of the substrate enclosed by a perimeter of the least one outgassing hole being free from the conductive material, the at least one outgassing hole being configured to release gasses and moisture absorbed in the anti-reflective coating film.

12. The method of claim 11, wherein the at least one outgassing hole is formed at least partially through the anti-reflective coating film.

13. The method of claim 11, wherein the anti-reflective coating film comprises high-k dielectric material.

14. The method of claim 11, wherein the anti-reflective coating film comprises multiple layers.

15. The method of claim 11, further comprising thinning the substrate.

16. The method of claim 11, wherein the light shielding layer comprises copper, aluminum, or tungsten.

17. The method of claim 11, wherein the at least one outgassing hole is formed at least 1 μm away from an edge of the light shielding layer, the at least one outgassing hole has a width or a diameter of at least 1 μm, and the light shielding layer has a width that is at least 10 μm.

18. A light sensing device, comprising:
a substrate;
a light sensing area on the substrate;
an anti-reflective coating film over the substrate;
a light shielding layer over the anti-reflective coating film, the light shielding layer not covering the light sensing area; and
at least one outgassing hole formed through the light shielding layer, the at least one outgassing hole extending below a bottommost surface of the light shielding layer and at least partially extending through the anti-reflective coating film, the at least one outgassing hole being configured to release unwanted gasses and moisture absorbed in the anti-reflective coating film, wherein the at least one outgassing hole is at least 1 μm away from an edge of the light shielding layer.

19. The light sensing device of claim 18, wherein the at least one outgassing hole comprises a plurality of outgassing holes, wherein the plurality of outgassing holes forms a perimeter around the light sensing area.

20. The light sensing device of claim 18, wherein the anti-reflective coating film comprises multiple layers.

* * * * *